(12) United States Patent
Hsieh et al.

(10) Patent No.: US 10,008,388 B2
(45) Date of Patent: Jun. 26, 2018

(54) DEVICE CONFORMITY CONTROL BY LOW TEMPERATURE, LOW PRESSURE, INDUCTIVELY COUPLED AMMONIA-NITROGEN TRIFLUORIDE PLASMA

(71) Applicant: Applied Materials, Inc., Santa Clara, CA (US)

(72) Inventors: Ping Han Hsieh, San Jose, CA (US); Teng-fang Kuo, San Jose, CA (US); Shi Wei Toh, Mountain View, CA (US); Avgerinos V. Gelatos, Redwood City, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days. days.

(21) Appl. No.: 15/413,944

(22) Filed: Jan. 24, 2017

(65) Prior Publication Data
US 2017/0301556 A1   Oct. 19, 2017

Related U.S. Application Data

(60) Provisional application No. 62/321,958, filed on Apr. 13, 2016.

(51) Int. Cl.
 *H01L 21/311* (2006.01)
 *H01L 21/768* (2006.01)

(52) U.S. Cl.
 CPC .. *H01L 21/31116* (2013.01); *H01L 21/76801* (2013.01)

(58) Field of Classification Search
 CPC ................................................ H01L 21/31116
 See application file for complete search history.

(56) References Cited

U.S. PATENT DOCUMENTS

| | | | |
|---|---|---|---|
| 6,383,880 B1 | 5/2002 | Ngo et al. | |
| 8,679,982 B2 * | 3/2014 | Wang | H01J 37/32357 216/37 |
| 8,945,414 B1 | 2/2015 | Su et al. | |
| 2010/0099263 A1 | 4/2010 | Kao et al. | |
| 2010/0151677 A1 | 6/2010 | Braeckelmann et al. | |
| 2014/0193979 A1 | 7/2014 | Or et al. | |
| 2016/0133480 A1 * | 5/2016 | Ko | H01L 21/31116 438/690 |

* cited by examiner

*Primary Examiner* — Duy Vu N Deo
(74) *Attorney, Agent, or Firm* — Patterson + Sheridan LLP

(57) ABSTRACT

The present disclosure generally relates to methods of removing oxides and oxide-containing layers from the surfaces of substrates. In one aspect, a method of processing a substrate comprises positioning a substrate in a process chamber, the substrate having an oxide layer thereon; introducing one or more process gases to an interior of the process chamber; ionizing the one or more process gases; exposing the oxide layer to the one or more ionized process gases, wherein the process chamber is maintained at a pressure less than about 50 mTorr during the exposing, and the substrate is maintained at a temperature within a range of about zero degrees Celsius to about 30 degrees Celsius during the exposing; and removing the oxide layer from the surface of the substrate.

20 Claims, 3 Drawing Sheets

DEVICE CONFORMITY CONTROL BY LOW TEMPERATURE, LOW PRESSURE, INDUCTIVELY COUPLED AMMONIA-NITROGEN TRIFLUORIDE PLASMA

CROSS-REFERENCE TO RELATED APPLICATIONS

This application claims benefit of U.S. Provisional Patent Application Ser. No. 62/321,958, filed Apr. 13, 2016, which is herein incorporated by reference.

BACKGROUND

Field

Implementations of the present disclosure generally relate to methods for removing oxide layers from substrates, such as semiconductor substrates.

Description of the Related Art

Native oxides are oxygen-containing layers which may form on the surface of a substrate. Native oxides may undesirably reduce the electrical conductivity of materials on which the native oxides are formed, and therefore, it may be desirable to remove native oxides in some circumstances. While some methods exist to remove native oxides, these conventional methods either lack selectivity with respect to other materials on the substrate, or are unable to sufficiently remove native oxides from high aspect ratio features.

Therefore, there is a need for improved methods of removing oxide materials.

SUMMARY

In one implementation, a method of processing a substrate comprises positioning a substrate in a process chamber, the substrate having an oxide layer thereon; introducing one or more process gases to an interior of the process chamber; ionizing the one or more process gases; exposing the oxide layer to the one or more ionized process gases to form a condensate layer, wherein the process chamber is maintained at a pressure less than about 50 mTorr during the exposing, and the substrate is maintained at a temperature within a range of about zero degrees Celsius to about 30 degrees Celsius during the exposing; and removing the condensate layer from the surface of the substrate.

In another implementation, a method of processing a substrate comprises positioning a substrate in a process chamber, the substrate having an oxide layer thereon; introducing one or more process gases to an interior of the process chamber, the one or more gases comprising $NF_3$ and $NH_3$; ionizing the one or more process gases; exposing the oxide layer to the one or more ionized process gases to form a condensate layer, wherein the process chamber is maintained at a pressure less than about 30 mTorr during the exposing, and the substrate is maintained at a temperature within a range of about zero degrees Celsius to about 30 degrees Celsius during the exposing; and removing the condensate layer from the surface of the substrate.

In another implementation, a method of processing a substrate comprises positioning a substrate in a process chamber, the substrate having an oxide layer thereon; introducing one or more process gases to an interior of the process chamber, the one or more gases comprising $NF_3$ and $NH_3$; ionizing the one or more process gases; exposing the oxide layer to the one or more ionized process gases to form a condensate layer, wherein the process chamber is maintained at a pressure less than about 50 mTorr during the exposing, and the substrate is maintained at a temperature within a range of about zero degrees Celsius to about 5 degrees Celsius during the exposing; and removing the condensate layer from the surface of the substrate.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and the disclosure may admit to other equally effective implementations.

Figure 1:
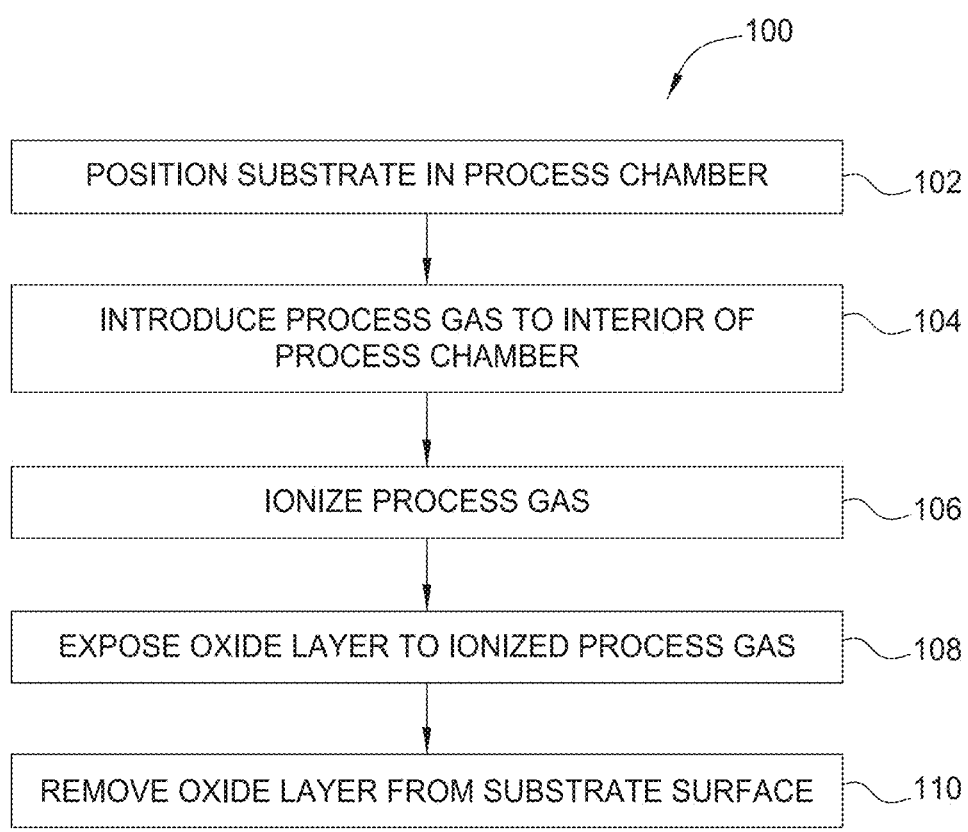
FIG. 1 illustrates a flow diagram of a method for removing an oxide layer from a surface of a substrate, according to one aspect of the disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The present disclosure generally relates to methods or removing oxides and oxide-containing layers from the surfaces of substrates. The methods generally utilize lower pressures and lower temperatures during processing to improve oxide removal selectivity as well as removal of oxides form high aspect ratio features. In one implementation, a oxide removal process includes exposing a substrate to ionized $NF_3$ and $NH_3$ gases while maintaining a pressure of about 50 millitorr (mTorr) or less and a temperature of about 5 degrees Celsius or less within a process chamber.

FIG. 1 illustrates a flow diagram of a method 100 for removing an oxide layer from a surface of a substrate, according to one aspect of the disclosure. The method 100 begins at operation 102. In operation 102, a substrate having an oxide layer thereon is positioned in a process chamber. The oxide layer may be a native oxide layer or other oxide layer. In one example, the oxide layer is a silicon oxide layer. In operation 104, one or more process gases are introduced to an interior volume of the process chamber. The one or more process gases may include $NH_3$, $NF_3$, carrier gases, and the like. In one example, when processing a substrate such as a 300 mm wafer, the process gases may have the following flow rates: $NH_3$ within a range of about 50 sccm to about 150 sccm, such as about 80 sccm to about 120 sccm, for example, about 100 sccm; $NF_3$ within a range of about 5 sccm to about 15 sccm, such as about 7 sccm to about 12 sccm, for example 10 sccm.

In operation 106, the process gases present within the process chamber are ionized. In one example, an inductively-coupled plasma (ICP) is generated to ionize the process gases. In such an example, the process gases may dissociate to form $F^-$, $H^+$, and $NH_2^-$ radicals, as well as ammonium fluoride ($NH_4F$). The ratio of $F^-$, $H^+$, and $NH_2^-$ radicals to $NH_4F$ can be adjusted through changes in pressure and temperature within the process chamber. For example, an increase in pressure results in an increase of $NH_4F$ and a reduction of $F^-$, $H^+$, and $NH_2^-$. While operation 106 is described with respect to in situ ICP processes, it is contemplated that other ionization techniques may be utilized. For example, it is contemplated that the process gases may be ionized in a remote plasma generator or using a capacitively coupled plasma.

In operation 108, the oxide layer on the substrate is exposed to the ionized gases generated in operation 106. The oxide layer present on the substrate, for example silicon dioxide, reacts with the $NH_4F$ to form an ammonium hexafluorosilicate $((NH_4)_2SiF_6)$ and oxygen gas film on the substrate. The pressure within the process chamber is maintained at about 50 mTorr or less, such as about 30 mTorr or less, during operation 108. The temperature of the substrate is maintained at about zero degrees Celsius to about 30 degrees Celsius, such as 5 degrees Celsius to zero degrees Celsius, during operation 108. It is contemplated temperatures within a range of about zero degrees Celsius to about 30 degrees Celsius facilitate condensation of $NH_4F$ on the substrate surface. The condensation of $NH_4F$ enhances removal of oxides from the substrate surface. In one example, a condensate layer may be formed at a rate of about 1.5 angstroms per second during operation 108.

Subsequently, in operation 110, the substrate is exposed to temperatures of about 90 degrees Celsius or greater to sublimate the $(NH_4)_2SiF_6$ (e.g., condensate layer) from the substrate surface, leaving a clean, oxide-free surface on the substrate. The substrate may then be subjected to additional processing, such as deposition of materials on the clean substrate surface.

Conventional oxidation removal approaches utilize relatively high temperatures and pressures, such as about 30 degrees Celsius and about 300 mTorr to 2 Torr or greater. However, such temperatures and pressures may not result in satisfactory removal of oxygen from the surface of the substrate, resulting in oxygen undesirably remaining on the surface of the substrate, thus affecting device performance. Pressures at the lower end of the conventional range, such as about 300 mTorr may improve oxygen removal but suffer from reduced selectivity between oxide layers and substrate material, such as between silicon dioxide and polysilicon. Additionally, conventional approaches are unable to remove oxide layers located within high aspect ratio features.

The inventors unexpectedly discovered that the temperature and pressure ranges disclosed herein overcome issues associated with conventional approaches. A reduction in pressure to about 50 mTorr or less provides $F^-$, $H^+$, and $NH_2^-$ radicals, as well as $NH_4F$, in the process chamber. The $NH_4F$ facilitates selectivity of oxide removal with respect to substrate material, while the $F^-$, $H^+$, and $NH_2^-$ radicals facilitate more complete removal of the oxide material. A reduced temperature, such as about 5 degrees Celsius or less, further increases the selectivity of oxide removal with respect to the substrate material. In additional, the relatively lower pressures utilized in implementations described herein facilitates removal of oxide materials from within high aspect ratio features. It is believed that the lower pressures utilized in aspects of the present disclosure do not negatively impact flow of process gases into or out of high aspect ratio features, thus allowing oxide materials within the high aspect ratio features to be removed.

Figure 2:
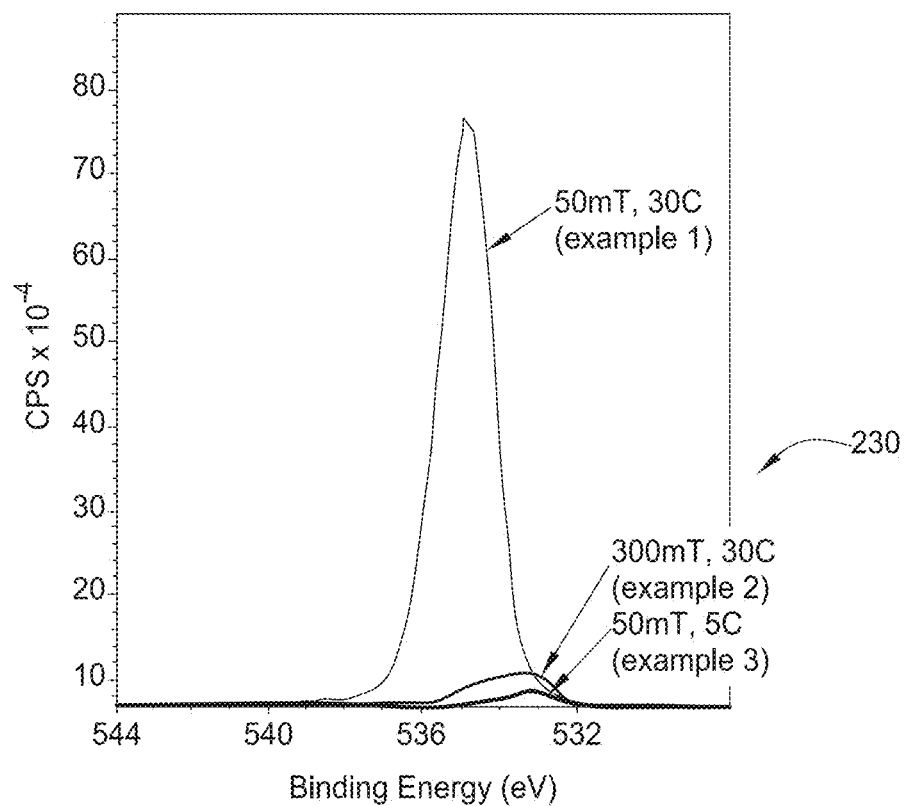
FIG. 2 is a graph illustrating binding energy of oxygen with a substrate under various process conditions.

FIG. 2 is a graph 230 illustrating binding energy of oxygen with a substrate under various process conditions. A lower XPS oxygen signal in the graph 230 corresponds to a cleaner substrate surface. In one example (Example 1), a substrate is process under conventional conditions of 50 mTorr and 30 degrees Celsius. Significant oxygen remains on the surface of the substrate after processing, thus adversely affecting device performance. In another example (Example 2) in which a substrate is processed using conventional conditions of 30 0mT and 30 degrees Celsius, oxygen is greatly removed from the substrate surface, however, selectivity is sacrificed at these conditions, as discussed above. In a final example (Example 3), a substrate is processed in conditions of the present disclosure, such as 50 mTorr and 5 degrees Celsius. In Example 3, less oxygen remains than compared to Examples 1 and 2. Additionally, selectivity is greater in Example 3 compared to Examples 1 and 2.

Figure 3:
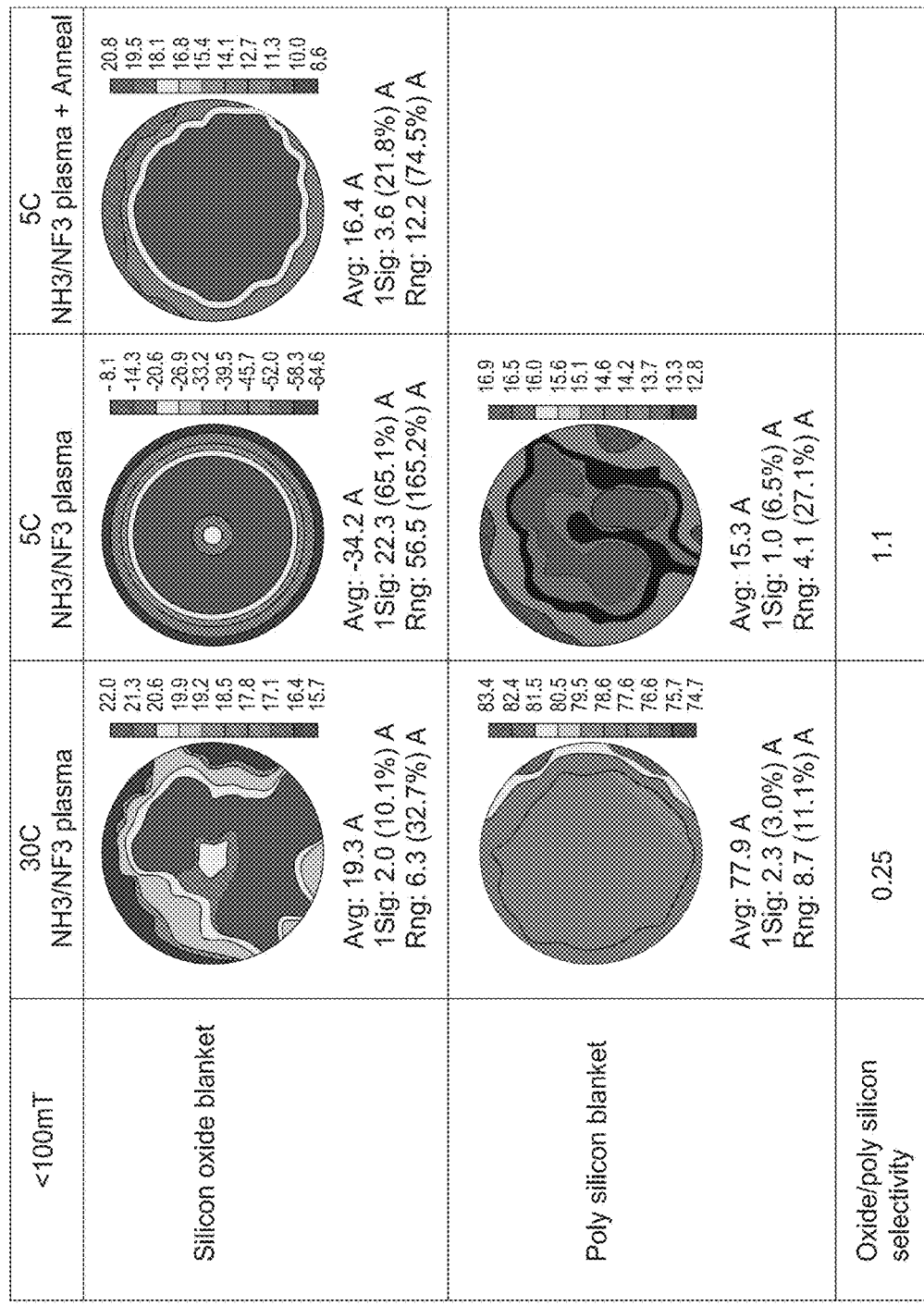
FIG. 3 illustrates oxide removal selectivity under various process conditions.

FIG. 3 illustrates oxide removal selectivity under various process conditions. In one example, a first substrate having a silicon oxide blanket layer thereon is exposed to a plasma of $NH_3$ and $NF_3$ gas at a temperature of 30 degrees Celsius and pressure less than 100 mTorr. 19.3 angstroms of material were removed from the substrate surface. Under the same process conditions, a second substrate having a blanket polysilicon layer is processed. A 77.9 angstrom layer of material was removed from the substrate surface, resulting in an oxide-to-polysilicon selectivity ration of about 0.25.

In another example, a first substrate having a silicon oxide blanket layer thereon is exposed to a plasma of $NH_3$ and $NF_3$ gas at a temperature of 5 degrees Celsius and pressure less than 100 mTorr. An ammonium hexafluorosilicate film was grown to a thickness of 34.2 angstroms in the presence of the ionized gas. This film was subsequently annealed at 90 degrees Celsius, resulting in a net removal of 16.4 angstroms of silicon oxide from the substrate. For comparison, a second substrate having a blanket polysilicon layer thereon was processed under the same conditions. 15.3 angstroms of material are removed from the second substrate, resulting in an oxide-to-polysilicon selectivity of 1.1.

Benefits of the aspects described herein include increased oxide removal selectivity compared to conventional approaches.

While the foregoing is directed to implementations of the present disclosure, other and further implementations of the disclosure may be devised without departing from the basic scope thereof, and the scope thereof is determined by the claims that follow.

What is claimed is:

1. A method of processing a substrate, comprising:
positioning a substrate in a process chamber, the substrate having an oxide layer thereon;
introducing one or more process gases to an interior of the process chamber;
ionizing the one or more process gases;
after ionizing the one or more process gases, exposing the oxide layer to the one or more process gases to form a condensate layer, wherein the process chamber is maintained at a pressure less than about 50 mTorr during the exposing, and the substrate is maintained at a temperature within a range of about zero degrees Celsius to about 30 degrees Celsius during the exposing; and
removing the condensate layer from the surface of the substrate.

2. The method of claim 1, wherein ionizing the one or more process gases comprises generating an inductively coupled plasma.

3. The method of claim 2, wherein the one or more process gases comprises NF3.

4. The method of claim 3, wherein the one or more process gases further comprises NH3.

5. The method of claim 1, wherein the process chamber is maintained at a pressure less than about 30 mTorr during the exposing.

6. The method of claim 1, where the condensate layer comprises ammonium hexafluorosilicate.

7. The method of claim 6, wherein the removing comprises sublimating the ammonium hexafluorosilicate.

8. The method of claim 1, wherein the substrate is maintained at a temperature within a range of about zero degrees Celsius to about 5 degrees Celsius during the exposing.

9. The method of claim 1, wherein the removing comprises sublimating the condensate layer.

10. The method of claim 9, wherein the sublimating comprises exposing the substrate to a temperature of about 90 degrees Celsius or greater.

11. A method of processing a substrate, comprising:
positioning a substrate in a process chamber, the substrate having an oxide layer thereon;
introducing one or more process gases to an interior of the process chamber, the one or more gases comprising $NF_3$ and $NH_3$;
ionizing the one or more process gases;
after ionizing the one or more process gases, exposing the oxide layer to the one or more process gases to form a condensate layer, wherein the process chamber is maintained at a pressure less than about 30 mTorr during the exposing, and the substrate is maintained at a temperature within a range of about zero degrees Celsius to about 30 degrees Celsius during the exposing; and
removing the condensate layer from the surface of the substrate.

12. The method of claim 11, wherein the removing comprises sublimating the condensate layer.

13. The method of claim 12, wherein the sublimating comprises exposing the substrate to a temperature of about 90 degrees Celsius or greater.

14. The method of claim 13, where the condensate layer comprises ammonium hexafluorosilicate.

15. The method of claim 14, wherein the substrate is maintained at a temperature within a range of about zero degrees Celsius to about 5 degrees Celsius during the exposing.

16. A method of processing a substrate, comprising:
positioning a substrate in a process chamber, the substrate having an oxide layer thereon;
introducing one or more process gases to an interior of the process chamber, the one or more gases comprising $NF_3$ and $NH_3$;
ionizing the one or more process gases;
after ionizing the one or more process gases, exposing the oxide layer to the one or more process gases to form a condensate layer, wherein the process chamber is maintained at a pressure less than about 50 mTorr during the exposing, and the substrate is maintained at a temperature within a range of about zero degrees Celsius to about 5 degrees Celsius during the exposing; and
removing the condensate layer from the surface of the substrate.

17. The method of claim 16, wherein the removing comprises sublimating the condensate layer.

18. The method of claim 17, wherein the sublimating comprises exposing the substrate to a temperature of about 90 degrees Celsius or greater.

19. The method of claim 18, where the condensate layer comprises ammonium hexafluorosilicate.

20. The method of claim 19, wherein ionizing the one or more process gases comprises generating an inductively coupled plasma.

* * * * *

UNITED STATES PATENT AND TRADEMARK OFFICE
CERTIFICATE OF CORRECTION

PATENT NO. : 10,008,388 B2
APPLICATION NO. : 15/413944
DATED : June 26, 2018
INVENTOR(S) : Ping Han Hsieh et al.

Page 1 of 1

It is certified that error appears in the above-identified patent and that said Letters Patent is hereby corrected as shown below:

On the Title Page

In Column 1, under "Notice:", Line 3, after "0 days." delete "days.".

In the Specification

In Column 3, Line 52, delete "$NH_2^-$" and insert -- $NH_2^-$ --, therefor.

In Column 4, Line 6, delete "30 0mT" and insert -- 300 mT --, therefor.

In the Claims

In Column 4, Line 65, in Claim 3, delete "NF3." and insert -- $NF_3$. --, therefor.

In Column 4, Line 67, in Claim 4, delete "NH3." and insert -- $NH_3$. --, therefor.

Signed and Sealed this
Fourth Day of September, 2018

Andrei Iancu
*Director of the United States Patent and Trademark Office*